United States Patent
Ogawa et al.

(10) Patent No.: US 9,411,231 B2
(45) Date of Patent: Aug. 9, 2016

(54) SILANE COMPOSITION AND CURED FILM THEREOF, AND METHOD FOR FORMING NEGATIVE RESIST PATTERN USING SAME

(71) Applicant: Central Glass Company, Limited, Ube-shi, Yamaguchi (JP)

(72) Inventors: Tsuyoshi Ogawa, Saitama (JP); Junya Nakatsuji, Fujimino (JP); Kazuhiro Yamanaka, Tachikawa (JP)

(73) Assignee: Central Glass Company, Limited, Ube-shi (JP)

( * ) Notice: Subject to any disclaimer, the term of this patent is extended or adjusted under 35 U.S.C. 154(b) by 0 days.

(21) Appl. No.: 14/350,691

(22) PCT Filed: Oct. 5, 2012

(86) PCT No.: PCT/JP2012/076021
§ 371 (c)(1),
(2) Date: Apr. 9, 2014

(87) PCT Pub. No.: WO2013/054771
PCT Pub. Date: Apr. 18, 2013

(65) Prior Publication Data
US 2014/0242516 A1    Aug. 28, 2014

(30) Foreign Application Priority Data

Oct. 12, 2011   (JP) ................................. 2011-224930
Oct. 5, 2012    (JP) ................................. 2012-222769

(51) Int. Cl.
*G03F 7/075*    (2006.01)
*H01L 21/02*    (2006.01)
(Continued)

(52) U.S. Cl.
CPC .............. *G03F 7/0757* (2013.01); *C08L 83/04* (2013.01); *C08L 83/12* (2013.01); *C09D 5/00* (2013.01);
(Continued)

(58) Field of Classification Search
CPC .... G03F 7/075; C09D 183/04; C09D 183/06; C09D 5/00; C08L 83/04; H01L 21/02126

USPC ............ 430/272.1; 528/33, 39; 428/447, 327
See application file for complete search history.

(56) References Cited

U.S. PATENT DOCUMENTS 4,552,919 A  *  11/1985  Mikami et al. ............... 524/860
5,811,482 A  *   9/1998  Sabia et al. .................. 524/366
(Continued)

FOREIGN PATENT DOCUMENTS

JP        2-129642 A        5/1990
JP        7-247434 A        9/1995
(Continued)

OTHER PUBLICATIONS

Machine translation of JP 7-247434 (no date).*
(Continued)

*Primary Examiner* — Amanda C Walke
(74) *Attorney, Agent, or Firm* — Crowell & Moring LLP

(57) ABSTRACT

A composition provided to contain:
an alkoxysilane condensate obtained by the condensation of
alkoxysilane A represented by general formula (1): $(CH_3)Si(OR^1)_3$ (In the general formula (1), $R^1$ mutually independently represents methyl group or ethyl group.),
alkoxysilane B represented by general formula (2): $(Ph)Si(OR^1)_3$ (In the general formula (2), $R^1$ mutually independently represents methyl group or ethyl group.), and
alkoxysilane C represented by general formula (3): $(CH_3)_2Si(OR^1)_2$ (In the general formula (3), $R^1$ mutually independently represents methyl group or ethyl group.) at an A:B:C mole ratio within the range of 30-70:10-50:20-60; and
a polyether-modified polydimethylsiloxane.

10 Claims, 1 Drawing Sheet

(51) Int. Cl.
  *C09D 183/04* (2006.01)
  *C09D 183/06* (2006.01)
  *C09D 5/00* (2006.01)
  *C08L 83/04* (2006.01)
  *C08L 83/12* (2006.01)
  *G03F 7/16* (2006.01)
  *C08G 77/46* (2006.01)
  *C08G 77/00* (2006.01)

(52) U.S. Cl.
  CPC ............ *C09D 183/04* (2013.01); *C09D 183/06* (2013.01); *G03F 7/168* (2013.01); *H01L 21/02126* (2013.01); *C08G 77/46* (2013.01); *C08G 77/80* (2013.01)

(56) References Cited

U.S. PATENT DOCUMENTS

| | | | |
|---|---|---|---|
| 8,304,161 B2 * | 11/2012 | Bradford et al. | 430/270.1 |
| 8,501,386 B2 * | 8/2013 | Ogihara et al. | 430/270.1 |
| 8,658,341 B2 * | 2/2014 | Maruyama et al. | 430/270.1 |
| 8,951,711 B2 * | 2/2015 | Ogihara et al. | 430/272.1 |
| 9,091,920 B2 * | 7/2015 | Sekito et al. | |
| 2005/0266344 A1 | 12/2005 | Sakurai et al. | |
| 2007/0195419 A1 | 8/2007 | Tsuda et al. | |
| 2010/0029804 A1 * | 2/2010 | Nakayama et al. | 522/172 |

FOREIGN PATENT DOCUMENTS

| | | | |
|---|---|---|---|
| JP | 10-246960 A | | 9/1998 |
| JP | 2001-262011 A | | 9/2001 |
| JP | 2002-332353 A | | 11/2002 |
| JP | 2005-82772 A | | 3/2005 |
| JP | 2005-126592 A | | 5/2005 |
| JP | 2006-91816 A | | 4/2006 |
| JP | 2006282787 A | * | 10/2006 |
| JP | 2007-246877 A | | 9/2007 |
| JP | 2008-285502 A | | 11/2008 |
| JP | 2009020268 A | * | 1/2009 |
| JP | 2009-51971 A | | 3/2009 |
| JP | 2009-263507 A | | 11/2009 |
| JP | 2010-26360 A | | 2/2010 |
| WO | WO 2005/036270 A1 | | 4/2005 |
| WO | WO 2008/047654 A1 | | 4/2008 |

OTHER PUBLICATIONS

Machine translation of JP 2005-082772 (no date).*
Machine translation of JP 2009-020238 (no date).*
International Search Report with English translation dated Jan. 8, 2013 (5 pages).
Taiwanese Office Action dated Jun. 13, 2014 (eleven (11) pages).

* cited by examiner

SILANE COMPOSITION AND CURED FILM THEREOF, AND METHOD FOR FORMING NEGATIVE RESIST PATTERN USING SAME

TECHNICAL FIELD

The present invention relates to a condensate and a photosensitive composition that use specified alkoxysilanes, a method for producing them, and a method for forming a negative resist pattern onto a substrate such as a glass substrate and a silicon substrate.

BACKGROUND OF THE INVENTION

In liquid crystal displays, touch panels, organic electroluminescences and the like, there have been used various kinds of protective films or insulating films. For example, an epoxy resin film formed by a wet process is used as a protective film for protecting a liquid-crystal display color filter in usual.

On the other hand, the insulating films are exemplified by those for use in TFT (thin-film-transistor), i.e., by those used for TFT liquid-crystal displays. There has been used a SiN film formed mainly by CVD process (Chemical Vapor Deposition) therefor.

The protective films and insulating films are required to be made from material that allows forming a film by wet process, the material having a further enhanced heat resistance in order to correspond to recent TFT liquid-crystal displays getting increased in response speed and in brightness of the back light source, the material being easier in film formation and superior in cost to conventional materials.

As an example of the material, it is possible to cite a silane condensate obtained by the hydrolysis and condensation reaction of alkoxysilanes (hereinafter, sometimes referred to as merely a condensate). Such a condensate is excellent in heat resistance, transparency in the visible range, and an adhesion to a glass or silicon substrate. Moreover, by specifying the kind and the composition of alkoxysilanes used as raw materials and by devising a production method, the condensate comes to exhibit high solubility in organic solvents. The above-mentioned condensate can form a film through wet process to serve as a protective or insulating film for a semiconductor device or a display.

The silane condensate also becomes usable as a hardmask, by increasing the silicon content in the condensate. More specifically, an organic polymer to be used as an insulating film for an integrated circuit is an organic substance as well as a resist film, so that it is difficult to attain a high etching rate at the time of dry etching if the resist film is superimposed on the insulating film. For this reason, a layer referred to as a hardmask and different from the insulating film and resist film in reactivity has been effectively disposed between the insulating film and resist film, in which silicon oxides and silicon nitrides have generally been used as the hardmask.

In the field of display and semiconductor, a substrate is often processed to have variously shaped thin films thereon, in which case photolithography is employed. Photolithography is a technique of exposing a resist film formed on a substrate such as a glass substrate and a silicon substrate to irradiation through a photomask and then transcribing a pattern of the photomask to the resist film by utilizing the difference of solubility between an irradiated portion and non-irradiated portion thereby forming a resist pattern. In the case of forming a pattern on a protective film or an insulating film, photolithography is conducted to form a resist pattern on the films, followed by performing dry etching to form a pattern.

In view of the above, there have been developed some resist materials that use silane condensate, the resist materials allowing a pattern formation by photography without a hardmask and not requiring forming a protective film or insulating film and a resist film independently (see Patent Documents 1-4). When these resist materials are used, it becomes possible to obtain a resist film achieving a performance as the protective film or insulating film and therefore it becomes possible to shorten the manufacturing time and to reduce the manufacturing cost.

In Patent Document 1, there is disclosed a negative resist material characterized by incorporating a resin having silanol groups and a compound which generates an acid by irradiation with high-energy beams.

In Patent Document 2, there is disclosed a photosensitive resin composition that contains, as its primary components, (1) an alkali-soluble siloxane polymer having methyl groups each directly combined with a silicon atom and silanol groups, wherein the content of silanol is 0.1-2.0 (the content of silanol is indicated by the absorbance ratio of the silanol group (900 $cm^{-1}$) to the silicon-methyl group (1271 $cm^{-1}$) at each absorption peak by the infrared spectroscopic analysis, and more specifically, indicated by "Abs(900 $cm^{-1}$)/Abs (1271 $cm^{-1}$)", (2) a compound to generate a reaction accelerator by action of radiation, and (3) a solvent.

In Patent Document 3, there is disclosed: a composition for forming a film, which comprises (A) an alkoxysilane condensation product produced by reacting a component (X) comprising phenyl triethoxysilane or phenyl trimethoxysilane, a component (Y) comprising methyl triethoxysilane or methyl trimethoxysilane and a component (Z) comprising triethoxysilane or trimethoxysilane at a certain ratio any ratio and (B) an acid generator which can generate an acid upon being exposed to an external stimulation such as light or heat; a method for producing a patterned film by using the composition; and an insulation film for an electronic device.

In Patent Document 4, there is disclosed a radiation curable composition that contains: a siloxane resin including a resin obtained by hydrolyzing and condensing essential components including a specified siloxane compound, a polymer or a partial condensate of the siloxane compound; a photo-acid generating agent or an optical base generating agent; and a solvent capable of dissolving the siloxane component and containing an aprotic solvent, where the siloxane compound includes tetraalkoxy silane and trialkoxy silane. Incidentally, the photo-acid generating agent is to generate acid by being irradiated with high-energy rays such as ultraviolet rays, X-rays and electron beams.

From the viewpoint of using a silane condensate obtained by hydrolysis and condensation reaction of alkoxysilanes as material for protective film, material for insulating film or material for resist film, there exist three problems as follows, for example.

The first problem resides in the storage stability of the condensate in itself. In the use of alkoxysilanes as the raw material, silanol (Si—OH) groups that remain in the condensate causes condensation reaction little by little during storage so as to increase in molecular weight and then becomes insoluble in an organic solvent at the time of being used as an application liquid, with which the application liquid is so increased in viscosity as to be difficult to form a film with uniform thickness.

The second problem is that a hard film with no cracks is difficult to obtain. Even in a case of attempting to form a hard silica film on a substrate by adjusting alkoxysilanes to be used in the condensate in terms of kind and composition ratio, the film is apt to be damaged by generation of cracks during baking particularly when it has a heavy thickness. For example, a protective film or insulating film for use in a semiconductor integrated circuit, having a thickness of at least 3.0 μm, is required to have a pencil hardness of at least 5H. It is difficult, for a silica film obtained by baking a silane condensate, to produce a film having a thickness of at least 3.0 μm, a pencil hardness of at least 5H and no cracks. If a silane compound e.g. a siloxane compound is used as a composition for a resist film, it acts as an insulating film or protective film for a semiconductor integrated circuit and remains on the circuit in contrast to an organic resist film, and therefore desired to be a hard film having no cracks.

The third problem is that cissing and unevenness are apt to occur in of the film when the condensate is applied to a substrate such as silicon substrate and a glass substrate as an application liquid.

REFERENCES ABOUT PRIOR ART

Patent Documents

Patent Document 1: Japanese Patent Application Publication No. H02-129642
Patent Document 2: Japanese Patent Application Publication No. H10-246960
Patent Document 3: International Application Publication No. 2008/047654 Pamphlet
Patent Document 4: Japanese Patent Application Publication No. 2006-091816

SUMMARY OF THE INVENTION

Problems to be Solved by the Invention

The present invention provides a silane composition, a cured film thereof and the like capable of solving the above-mentioned problems. Furthermore, the present invention provides: a resist composition to which a photoacid generator that can generate acid by the action of high-energy rays such as ultraviolet rays, X-rays and electron beams; and a method for forming a negative resist pattern, wherein the resist composition with the addition of a solvent is applied onto a substrate to form a resist film and then photolithography is performed in the use of high-energy rays thereby forming a negative resist pattern. Incidentally, the silane composition means a composition containing a silane condensate.

Means for Solving the Problems

A first embodiment of the present invention is a composition obtained by adding a polyether-modified polydimethylsiloxane to a condensate in which three kinds of alkoxysilanes having different structures are used and the composition ratio is adjusted. This composition accomplishes high pencil hardness and improved in scratch resistance, when it becomes a cured film, by the effect of adding the polyether-modified polydimethylsiloxane.

A second embodiment of the present invention is a hard silica film having a thickness of at least 3.0 μm and a pencil hardness of at least 5H and no cracks, obtained by: a step of adding a polyether-modified polydimethylsiloxane and an organic solvent to the above-mentioned silane condensate to prepare an application liquid; a step of applying the application liquid onto a substrate such as a glass substrate and a silicon substrate; and a step of thereafter heating and baking the substrate. In this silica film, none of cissing, unevenness and the like was observed at the time of application, by the effect of adding the polyether-modified polydimethylsiloxane.

A third embodiment of the present invention is a method for producing a condensate, provided to include: a step of adding an acid catalyst, pure water (hereinafter referred to as merely water) and an organic solvent to three kinds of alkoxysilanes; a step of subjecting them to hydrolysis and condensation reaction; a step of thereafter independently adding water to remove the acid catalyst; and a step of thereafter removing the organic solvent. This condensate was excellent in storage stability.

A fourth embodiment of the present invention is a resist pattern. More specifically, a polyether-modified polydimethylsiloxane and an organic solvent are added to the silane condensate to prepare an application liquid, and then a photoacid generator is added thereto. This application liquid served usable as a resist liquid for use in photolithography.

The present invention involves the following inventions 1-15.

In this specification, —CH₃ group, —CH₂CH₃ group and —C₆H₅ group may be abbreviated to Me, Et and Ph.

[Invention 1]

A composition comprising:
1) an alkoxysilane condensate obtained by the condensation of
   i) alkoxysilane A represented by general formula (1): $(CH_3)Si(OR^1)_3$ (In the general formula (1), $R^1$ mutually independently represents methyl group or ethyl group.),
   ii) alkoxysilane B represented by general formula (2): $(Ph)Si(OR^1)_3$ (In the general formula (2), $R^1$ mutually independently represents methyl group or ethyl group.), and
   iii) alkoxysilane C represented by general formula (3): $(CH_3)_2Si(OR^1)_2$ (In the general formula (3), $R^1$ mutually independently represents methyl group or ethyl group.) at an A:B:C mole ratio within the range of 30-70:10-50:20-60; and
2) a polyether-modified polydimethylsiloxane.

[Invention 2]

A composition of Invention 1, wherein the polyether-modified polydimethylsiloxane is a compound represented by general formula (4):

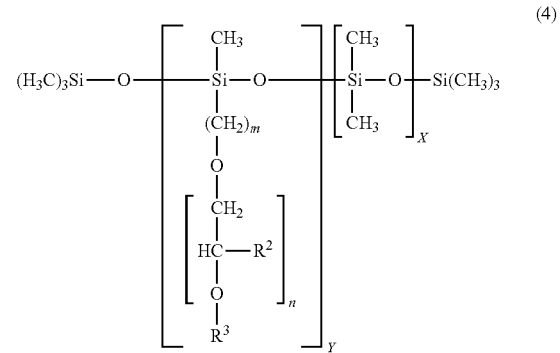

(In the formula, $R^2$ mutually independently represents a hydrogen atom or a methyl group, $R^3$ mutually independently represents a $C_1$-$C_{20}$ alkyl group or a $C_6$-$C_{10}$ aryl group, "m" represents an integer of 1-30, "n" represents an integer of 1-30, "X" represents an integer of 1-50, and "Y" represents an integer of 1-50.) and wherein the content of the polyether-modified polydimethylsiloxane is not lower than 0.001 mass % and not higher than 5.000 mass % relative to the condensate.

[Invention 3]

A composition of Invention 1 or 2, further comprising a photoacid generator.

[Invention 4]

A composition of Invention 3, wherein the content of the photoacid generator is not lower than 0.01 mass % and not higher than 5.00 mass % relative to the condensate.

[Invention 5]

A cured film comprising a cured substance obtained by curing a composition of Inventions 1 to 4.

[Invention 6]

A method for producing a cured film comprising the steps of
- a step of adding an organic solvent to a composition of Inventions 1 to 4 to produce an application liquid;
- a step of applying the application liquid onto a substrate to form a film; and
- a step of thereafter heating and baking the substrate, wherein the cured film has a thickness of at least 3.0 μm and a pencil hardness of at least 5H.

[Invention 7]

A method for producing a composition of Invention 1, comprising the steps of;
- a first step of adding water, a water-soluble organic solvent E and an acid catalyst to an alkoxysilane mixture D of before the condensation of
  - alkoxysilane A represented by general formula (1); $(CH_3)Si(OR^1)_3$ (In the general formula (1), $R^1$ mutually independently represents methyl group or ethyl group.),
  - alkoxysilane B represented by general formula (2); $(Ph)Si(OR^1)_3$ (In the general formula (2), $R^1$ mutually independently represents methyl group or ethyl group.), and
  - alkoxysilane C represented by general formula (3); $(CH_3)_2Si(OR^1)_2$ (In the general formula (3), $R^1$ mutually independently represents methyl group or ethyl group.)

at an A:B:C mole ratio within the range of 30-70:10-50:20-60 thereby producing a mixed substance of before condensation;
- a step of hydrolyzing and condensing the mixed substance of before condensation thereby providing a reaction system with a condensate;
- a step of extracting the condensate with a water-insoluble organic solvent F while extracting the acid catalyst with water;
- a step of removing the organic solvent F; and
- a step of adding a polyether-modified polydimethylsiloxane.

[Invention 8]

A method for producing a composition, as discussed in Invention 7, wherein water is used in an amount of 1.5-5 times larger than that of alkoxy groups that the alkoxysilane mixture D has, in mole ratio.

[Invention 9]

A method for producing a composition, as discussed in Invention 7 or 8, wherein the organic solvent E comprises alcohol.

[Invention 10]

A method for producing a composition, as discussed in Inventions 7 to 9, wherein the acid catalyst comprises acetic acid.

[Invention 11]

A method for forming a negative pattern, comprising the steps of a step of applying a composition as claimed in claim 3 or 4 onto a substrate to form a film, a step of irradiating the film with high-energy beams to generate acid at an irradiated portion to accelerate a further condensation of the condensate at the irradiated portion thereby making the film insoluble in an alkali developing solution; and a step of removing a non-irradiated portion of the film by using the alkali developing solution thereby forming a negative pattern.

For information, the composition is dissolved in an organic solvent G (e.g. a polar solvent) to be served as the application liquid, and thereafter applied onto a substrate to form a film. After the application, prebaking is performed as necessary.

[Invention 12]

A method for forming a negative pattern, as discussed in Invention 11, wherein the high-energy beams used for the irradiation comprises electromagnetic waves or electron beams of a wavelength of not larger than 400 nm.

[Invention 13]

A protective film comprising a cured substance obtained by curing a composition of Invention 1 or 2. For example, this protective film is formed of a cured film comprising a composition of Invention 1 or 2.

[Invention 14]

An insulating film comprising a cured substance obtained by curing a composition of Invention 1 or 2. For example, this insulating film is formed of a cured film comprising a composition of Invention 1 or 2.

[Invention 15]

A resist comprising a cured substance obtained by curing a composition of Invention 3 or 4.

Effects of the Invention

A condensate obtained by a method for producing a silane condensate, according to the present invention is excellent in storage stability.

An application liquid obtained by dissolving a composition containing a silane condensate and a polyether-modified polydimethylsiloxane according to the present invention in an organic solvent was applied onto a substrate such as a glass substrate and a silicon substrate by wet process to form a film, and then heated and baked. As a result of this, there was obtained a film having a thickness of at least 3.0 μm and a pencil hardness of at least 5H and no cracks.

This film is excellent in heat resistance, high in transparency in the visible range, good in adhesion to a glass or silicon substrate, low in water absorbability, and usable as a protective film or insulating film for use in liquid crystal display or in semiconductor integrated circuit.

Moreover, as a result of adding a photoacid generator to the application liquid, there was obtained a preferably usable resist liquid with which a negative pattern is obtained by photolithography, the resist liquid also having the function of a protective film or insulating film and not requiring the above-mentioned hardmask.

MODE(S) FOR CARRYING OUT THE INVENTION

Hereinafter, a silane composition, a cured film thereof, a method for producing a silane condensate, and a method for forming a negative resist pattern using the same according to the present invention will specifically be discussed.

1. Composition Using Silane Condensate 1-1. Composition Used in a Cured Film for Use in a Protective Film or Insulating Film for Semiconductor Integrated Circuit A silane composition according to the present invention is formed from an alkoxysilane condensate obtained by using three kinds of alkoxysilanes A, B and C mixed at a certain ratio and by adding a polyether-modified polydimethylsiloxane thereto. The polyether-modified polydimethylsiloxane improves the wettability of a film formed on a glass or silicon substrate while improving the hardness of after baking (examined by a pencil hardness test) and provides a hard film having a pencil hardness of at least 5H and no cracks. In the case of using a composition not containing the polyether-modified polydimethylsiloxane, it becomes difficult to obtain a favorable film with no cissing and unevenness, and additionally a soft film poor in pencil hardness is provided.

More specifically, the present invention is directed to a composition comprising:

an alkoxysilane condensate obtained by the condensation of alkoxysilane A represented by general formula (1): $(CH_3)Si(OR^1)_3$ (In the general formula (1), $R^1$ mutually independently represents methyl group or ethyl group.), alkoxysilane B represented by general formula (2): $(Ph)Si(OR^1)_3$ (In the general formula (2), $R^1$ mutually independently represents methyl group or ethyl group.), and alkoxysilane C represented by general formula (3): $(CH_3)_2Si(OR^1)_2$ (In the general formula (3), $R^1$ mutually independently represents methyl group or ethyl group.) at an A:B:C mole ratio within the range of 30-70:10-50:20-60; and a polyether-modified polydimethylsiloxane.

The condensate contained in the composition of the present invention is provided to have a complicated three-dimensional network structure obtained by hydrolyzing and condensing the above-mentioned three kinds of alkoxysilanes A to C.

Figure 1:
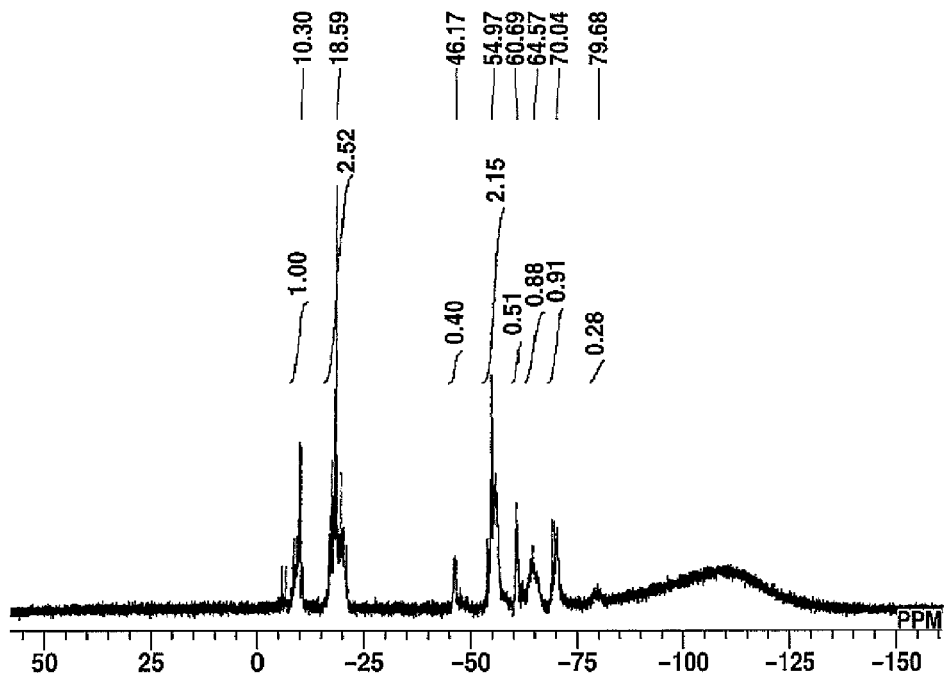
FIG. 1 A $^{29}Si$ NMR spectrum of a condensate obtained from an alkoxysilane mixture D of alkoxysilane A $((CH_3)Si(OR^1)_3)$, alkoxysilane B $((Ph)Si(OR^1)_3)$ and alkoxysilane C $(CH_3)_2Si(OR^1)_2)$ at an A:B:C mole ratio of 40:20:40.

For example, it is assumed from a $^{29}Si$ NMR spectrum as shown in FIG. 1 that the condensate obtained from alkoxysilane A represented by the general formula (1), alkoxysilane B represented by the general formula (2) and alkoxysilane C represented by the general formula (3) includes a structure as shown below. A bonding hand illustrated in the structure by a wiggly line means that a network of siloxane bonds is continuously developed beyond there.

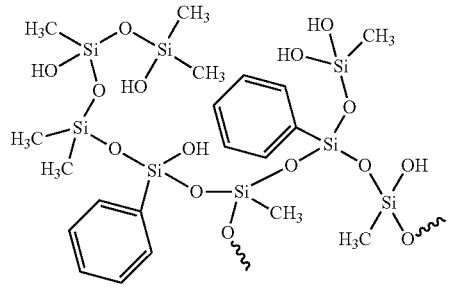

In the present invention, in order that a condensate obtained from alkoxysilanes A to C exhibits an excellent storage stability and that a hard film is provided to have a thickness of at least 3.0 μm, a pencil hardness of at least 5H and no cracks by adding a polyether-modified polydimethylsiloxane at the time of forming a film and then baking the film, it is preferable to prepare alkoxysilane A, alkoxysilane B and alkoxysilane C at an A:B:C mole ratio within the range of 30-70:10-50:20-60.

If the content of alkoxysilane A is higher than 70 mol %, a cured film obtained upon heating and baking tends to be affected by cracks when the film has a thickness of at least 3.0 μm; meanwhile, the content lower than 30 mol % makes it difficult to produce a hard film having a pencil hardness of at least 5H. If the content of alkoxysilane B is lower than 10 mol %, the film tends to be affected by cracks when the film has a thickness of at least 3.0 μm; meanwhile, the content higher than 50 mol % makes it difficult to produce a hard film having a pencil hardness of at least 5H. If the content of alkoxysilane C is lower than 20 mol %, the film tends to be affected by cracks when the film has a thickness of at least 3.0 μm; meanwhile, the content higher than 60 mol % makes it difficult to produce a hard film having a pencil hardness of at least 5H.

Figure 2:
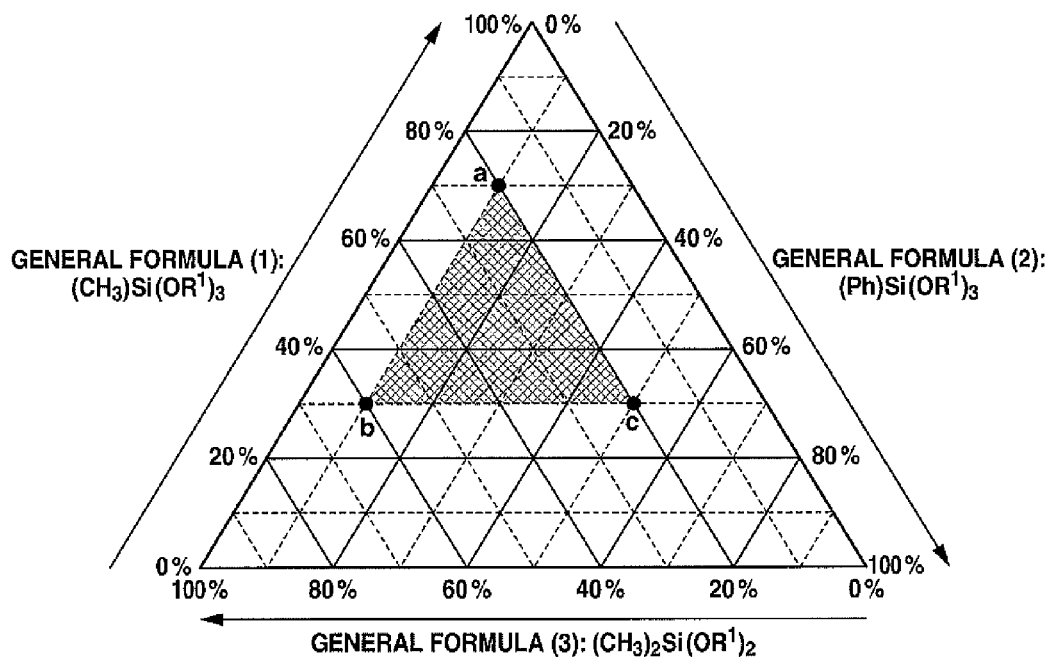
FIG. 2 A graph showing preferable mole ratios among alkoxysilane A represented by general formula (1): $(CH_3)Si(OR^1)_3$, alkoxysilane B represented by general formula (2): $(Ph)Si(OR^1)_3$, and alkoxysilane C represented by general formula (3): $(CH_3)_2Si(OR^1)_2$.

Additionally, preferable mole ratios among alkoxysilanes A to C is shown in FIG. 2. In the composition of the present invention, it is preferable to use alkoxysilanes A to C mixed at a molar percentage ratio within the hatched range enclosed by three points a, b and c as shown in FIG. 2.

The mole ratios at the points a, b and c are A:B:C=70:10:20, A:B:C=30:10:60 and A:B:C=30:50:20, respectively.

When the condensate is obtained from the raw material alkoxysilanes at an A:B:C mole ratio out of the range of 30-70:10-50:20-60, it becomes difficult to form the above-mentioned film having a thickness of at least 3.0 μm and no cracks, and additionally, a hard film having a pencil hardness of at least 5H is hard to be obtained after heating and baking. Thus, it is difficult to put it to practical use as a protective film or insulating film for use in display or semiconductor.

In heating performed for curing a film (formed by dissolving the composition in a solvent and then applying it to a substrate) to have a pencil hardness of at least 5H, the temperature of the substrate is preferably not lower than 150° C. and not higher than 250° C. while the heating time is preferably not less than 15 minutes and not more than 180 minutes. When the substrate temperature is lower than 150° C. or the heating time is less than 15 minutes, a hard film having a pencil hardness of at least 5H is hard to be obtained. Meanwhile, a substrate temperature of higher than 250° C. or a heating time of more than 180 minutes is not required or not said to be a practical production method. Incidentally, in an overcoat-forming step usually employed in liquid crystal displays, the upper limit of the heating temperature is 250° C.

The polyether-modified polydimethylsiloxane used in the present invention is preferably a liquid compound represented by general formula (4), available from BYK-Chemie GmbH (Germany) under the trade name of BYK300, BYK301, BYK302, BYK306, BYK307, BYK330, BYK331, BYK333, BYK337, BYK341, BYK342, BYK378 etc.

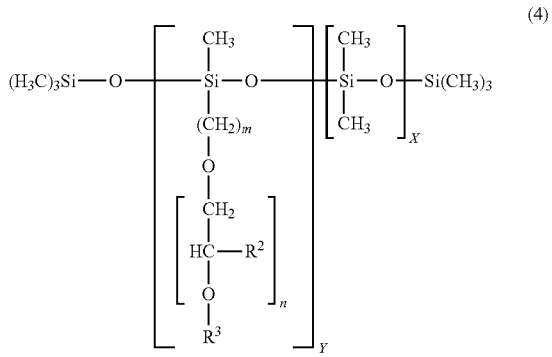

(In the formula (4), $R^2$ represents a hydrogen atom or a methyl group, $R^3$ represents a $C_1$-$C_{20}$ alkyl group or a $C_6$-$C_{10}$ aryl group, "m" represents an integer of 1-30, "n" represents an integer of 1-30, "X" represents an integer of 1-50, and "Y" represents an integer of 1-50.)

The composition of the present invention is dissolved in an organic solvent G, preferably in a polar solvent to be an application liquid and then applied onto a substrate such as a glass substrate and a silicon substrate by wet process to form a film. For example, the application liquid is applied onto the substrate and then prebaked or heated to remove the organic solvent G thereby being a film. Upon being heated and baked, the film becomes usable as a protective film or insulating film for a display or semiconductor, or as a hardmask or insulating film in the field of semiconductor fabrication.

Preferable examples of a polar solvent usable as the organic solvent G include propylene glycol monomethyl ether acetate (hereinafter abbreviated to PGMEA), propylene glycol monomethyl ether, cyclohexanone, γ-butyrolactone, methyl ethyl ketone, methyl isobutyl ketone, N,N-dimethylformamide and N-methylpyrrolidone, and it is also possible to use them in combination.

1-2. Composition Used in a Cured Film for Use in a Resist

The application liquid can serve as a composition (liquid) used in a cured film for use in a resist, with the addition of a photoacid generator as a component, the photoacid generator being able to generate acid by the action of high-energy rays or to generate acid by absorption of applied high-energy rays. The photoacid generator can be exemplified by triphenylsulfonium trifluoromethanesulfonate, and commercially available from: BASF Corporation (Germany) under the trade name of Irgacure PAG121, Irgacure PAG103, Irgacure CGI1380 and Irgacure CGI725; Midori Kagaku Co., Ltd. under the trade name of PAI-101, PAI-106, NAI-105, NAI-106, TAZ-110 and TAZ-204; San-Apro Ltd. under the trade name of CPI-200K, CPI-210S, CPI-101A, CPI-110A, CPI-100P, CPI-110P, CPI-100TF, HS-1, HS-1A, HS-1P, HS-1N, HS-1TF, HS-1NF, HS-1MS, HS-1CS, LW-S1, LW-S1NF; and SANWA CHEMICAL CO., LTD. under the trade name of TFE-triazine, TME-triazine and MP-triazine.

2. Method for Producing Composition

The condensate of the above-mentioned alkoxysilanes A to C is produced by charging a reaction vessel with the above-mentioned alkoxysilanes A to C at room temperature to prepare an alkoxysilane mixture D (or a mixture of alkoxysilanes A to C) and then by gathering water that can hydrolyze the alkoxysilanes, a solvent E (preferably alcohol e.g. ethanol and isopropanol) that serves as a reaction solvent and an acid catalyst (preferably acetic acid) that can accelerate the condensation reaction into the reaction vessel and then by heating the reaction vessel to the reaction temperature and then by stirring the content to cause the hydrolysis and condensation reaction. In order to prevent unreacted raw materials, water, alcohol and acetic acid in the reaction system from being distilled out of the reaction system, it is preferable that the reaction vessel is equipped with a condenser. A time required for the condensation reaction is usually 3 to 24 hours, and the reaction temperature is not lower than 70° C. and not higher than 100° C. The condensation reaction is made difficult to develop at a temperature lower than 70° C., and made difficult to control in terms of degree of polymerization at a temperature higher than 100° C.

Moreover, water used in the hydrolysis and condensation reaction caused to obtain the condensate is not smaller than 1.5 times and not larger than 5 times the total amount of alkoxy groups that the raw material alkoxysilanes have, in mole ratio. In a case of smaller than 1.5 times, hydrolysis is not sufficiently developed and therefore the condensate becomes poor in storage stability. Meanwhile, water exceeding 5 times is not needed.

In the hydrolysis and condensation reaction caused to obtain the condensate, the solvent E is preferably alcohol and exemplified by ethanol, normal propanol, isopropanol or normal butanol, isobutyl alcohol, tert-butyl alcohol and the like.

The reaction vessel was cooled to room temperature (20° C.) after the condensation reaction. Then, a condensate that exists in the reaction system is brought into contact with an organic solvent F (which can dissolve the condensate therein and not compatible with water) to be extracted. Thereafter acetic acid contained in the organic solvent F was rinsed with water to be removed.

Subsequently, a solid desiccant is used to remove a small amount of water dissolved in the organic solvent F and then the solid desiccant is removed by filtration. The organic solvent F is thereafter removed under a reduced pressure thereby acquiring the condensate. The thus acquired condensate becomes a composition of the present invention with the addition of a polyether-modified polydimethylsiloxane. In order to obtain a resist composition, it is preferable that a photoacid generator is also added.

As the organic solvent F, it is preferable to use a water-insoluble solvent that can dissolve the condensate and not compatible with water. An example thereof is ether, and more specifically, diethyl ether, isopropyl ether and dibutyl ether. The solid desiccant is exemplified by magnesium sulfate.

3. Method for Forming Negative Resist Pattern

A resist film is obtained by applying a resist liquid containing a composition of Invention 3 or 4 that contains a photoacid generator onto a substrate such as a glass substrate and a silicon substrate by wet process to form a film. For example, the resist film can be obtained by applying the resist liquid onto the substrate and then prebaking or heating it to remove an organic solvent G. This resist film is subjected to photolithography thereby forming a negative resist pattern. More specifically, the resist film is irradiated with high-energy beams through a photomask formed having a pattern to generate acid by the photoacid generator at an irradiated portion to further accelerate the condensation of the resist film at the irradiated portion thereby making the resist film insoluble in a developing solution only at a non-irradiated portion. If development is conducted thereon by using a developing solution, the non-irradiated portion is dissolved in the developing solution while the irradiated portion remains on the substrate, with which a negative resist pattern is formed.

Subsequently, the negative resist pattern is heated and baked to condense silanol groups that remain in the pattern. Though the temperature for heating and baking is preferably high in order to obtain a highly-hard thin film, the upper limit of the temperature depends on a production process for display or semiconductor. For example, in an overcoat-forming step usually employed in liquid crystal displays, the upper limit of the heating temperature is 250° C.

The developing solution used in the method of forming the negative resist pattern in the use of the photosensitive composition of the present invention is exemplified by a tetramethylammonium hydroxide aqueous solution and the like.

The high-energy beam used in the method of forming the negative resist pattern in the use of the composition of the present invention is exemplified by high-energy beam having a wavelength of not longer than the ultraviolet region and more specifically a wavelength range of not longer than 400 nm, such as ultraviolet rays from a high-pressure mercury lamp, i-lines (365 nm wavelength), a KrF excimer laser (248 nm wavelength), an ArF excimer laser (193 nm wavelength), extreme ultraviolet rays (13.5 nm wavelength), and electron beams.

4. Purposes

The composition of the present invention can be used in a protective film and insulating film in the field of displays e.g. liquid crystal displays, touch panels, organic EL (electroluminescence).

Moreover, the composition of the present invention can also be used in a hardmask and various kinds of insulating film in semiconductor fabrication, because of its large silicon content.

The composition containing a photoacid generator that can generate acid by the action of high-energy beams according to the present invention is dissolved in an organic solvent G to prepare a resist liquid, and the resist liquid is applied onto a substrate such as a glass substrate and a silicon substrate by wet process to form a resist film. The resist film is irradiated with high-energy beams through a photomask by photolithography to generate acid at an irradiated portion to further accelerate the condensation of the resist film at the irradiated portion thereby making the resist film insoluble in a developing solution. By conducting development on the resist film in the use of a developing solution, the resist film becomes usable as a negative resist pattern to which a pattern of the photomask is transcribed.

EXAMPLES

Referring now to Examples, the present invention will be discussed in detail; however, the present invention is not limited to those examples.

The average molecular weight (Mw) of a condensate was measured by using gel permeation chromatography (hereinafter abbreviated to GPC) and by using tetrahydrofuran as a solvent, in terms of polystyrene. The thickness of a resist film formed on a silicon substrate was measured by a stylus type surface profiler, and the pencil hardness of the film formed on the silicon substrate was measured by a scratch hardness tester. Measurement apparatuses used in Examples of the present invention are shown as below.

GPC: HLC-8320GPC available from TOSOH CORPORATION Column: TSKgelGMHXL available from TOSOH CORPORATION Stylus type surface profiler: Dektak8 available from Veeco (America) Electric pencil scratch hardness tester: No. 553-M available from Yasuda Seiki seisakusho LTD.

Example 1

Synthesis of Condensate

A three-neck flask having a volumetric capacity of 1 L and equipped with a fluoroplastic stirring impeller and a Dimroth condenser was charged with 59.45 g (0.333 mol) of $(CH_3)Si(OEt)_3$ serving as alkoxysilane A, 40.08 g (0.167 mol) of $PhSi(OEt)_3$ serving as alkoxysilane B and 49.43 g (0.333 mol) of $(CH_3)_2Si(OEt)_2$ serving as alkoxysilane C. The A:B:C mole ratio was 40:20:40, which was within the range of the composition ratio of an alkoxysilane mixture D for a condensate of the present invention.

Then, the three-neck flask was further charged with 104.83 g of isopropanol, 77.94 g (4.330 mol) of water and 0.06 g of acetic acid and heated to 90° C. to cause the hydrolysis and condensation reaction. Three hours later, the reaction liquid (the reaction system) was cooled to room temperature (20° C.). Subsequently the three-neck flask was further charged with 200 ml of isopropyl ether and 200 ml of water and then stirred so that the reaction liquid was separated into two phases. The upper phase (an organic phase) was collected and rinsed with 200 ml of water three times. Then, a small amount of water dissolved in isopropyl ether was removed by magnesium sulfate, followed by filtering magnesium sulfate out. By distilling isopropyl ether out under a reduced pressure by using an evaporator, a condensate was obtained in the form of a colorless viscous liquid. The yield of the condensate was 64.98 g and the average molecular weight was Mw=980.

A $^{29}Si$ NMR (Nuclear Magnetic Resonance) spectrum is shown in FIG. 1. Incidentally, the amount of used water was two times larger than that of alkoxy groups that the alkoxysilane mixture D had, in mole ratio.

Subsequently, 0.02 g of a polyether-modified polydimethylsiloxane (available from BYK-Chemie GmbH (Germany) under the trade name of BYK307) was added to 20.33 g of the condensate thereby obtaining a composition that fell within the range of the present invention. The content of the polyether-modified polydimethylsiloxane was 0.10 mass % relative to the mass of the obtained condensate.

[Formation of Negative Resist Pattern Using Composition]

The above-mentioned composition having an amount of 5.20 g was dissolved in 4.70 g of PGMEA with the addition of 0.05 g of a photoacid generator (available from San-Apro Ltd. under the trade name of CPI-100Tf) thereby preparing an application liquid (or a resist liquid). The resist liquid was applied onto a silicon substrate having a diameter of 100 mm by using a spin coater at a rotation speed of 250 rpm and a retention time of 10 seconds to form a resist film, followed by heating and prebaking the substrate at 90° C. for 1 minute. Incidentally, the content of the photoacid generator was 0.96 mass % relative to the mass of the condensate.

Then, the resist film formed on the silicon substrate was exposed to irradiation with ultraviolet rays having a wavelength of 365 nm for 2 minutes through a photomask formed with a pattern and installed in a mask aligner (or a mask alignment apparatus available from Suss Microtec k.k. as the model MA6). The silicon substrate was taken out of the mask aligner and brought into contact with a developing solution (a tetramethylammonium hydroxide aqueous solution of 2.38 mass % concentration) for 20 seconds to dissolve a non-irradiated portion thereby developing the pattern. On the substrate, a negative resist pattern with a minimum line width of 10 μm was formed. Thereafter, the silicon substrate was brought into an oven of 250° C. for 1 hour to heat and bake the negative resist pattern thereby obtaining a silicon substrate having a negative resist pattern and 3.6 μm thickness. It was confirmed that the resist film formed on the silicon substrate had no cracks, i.e., it was confirmed that the negative resist pattern was excellently formed. For information, the thickness was obtained by measuring depth differences in the pattern by using Dektak 8. On the other hand, a film obtained by conducting the exposure not through a photomask and then performing baking under the above-mentioned conditions was measured by the above-mentioned apparatus in terms of pencil hardness; as a result, a good pencil hardness of 5H was confirmed. Incidentally, CPI-100Tf used as the photoacid generator has a chemical structure as shown below.

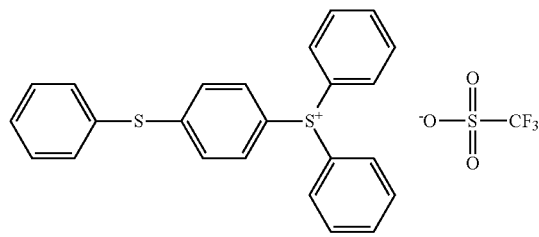

[Storage Stability]

The above-mentioned resist liquid was stored in a refrigerator of 5° C. or lower for three months. In the liquid of after the storage, neither whitening nor deposition of solid content was observed, with which an excellent storage stability was exhibited. Subsequently, the formation of a negative resist pattern was tried under the above-mentioned conditions and procedure; as a result, there was obtained a silicon substrate having a negative resist pattern and 3.7 μm thickness and it was confirmed that the resist pattern formed on the silicon substrate had no cracks, i.e., it was confirmed that the negative resist pattern was excellently obtained. The above-mentioned procedure was repeated in order to measure the pencil hardness thereby resulting in a pencil hardness of 5H, which was a satisfying hardness. Thus, the obtained resist film was found not having been subjected to deterioration with time during the storage of the resist liquid.

Example 2

Synthesis of Condensate

A three-neck flask of the same type as that used in Example 1 was charged with 44.6 g (0.250 mol) of $(CH_3)Si(OEt)_3$ serving as alkoxysilane A, 12.0 g (0.050 mol) of $PhSi(OEt)_3$ serving as alkoxysilane B and 29.6 g (0.200 mol) of $(CH_3)_2Si(OMe)_2$ serving as alkoxysilane C. The A:B:C mole ratio was 50:10:40, which was within the range of the composition ratio of an alkoxysilane mixture D for a condensate of the present invention.

Then, the three-neck flask was further charged with 62.4 g of isopropanol, 46.8 g (2.600 mol) of water and 0.03 g of acetic acid, and the procedure of Example 1 was repeated thereby synthesizing a condensate. The yield of the condensate was 64.98 g and the average molecular weight was Mw=1200. Incidentally, the amount of used water was two times larger than that of alkoxy groups that the alkoxysilane mixture D had, in mole ratio.

Subsequently, 0.06 g of BYK307 (as a polyether-modified polydimethylsiloxane) was added to the condensate thereby obtaining a composition that fell within the range of the present invention. The content of the polyether-modified polydimethylsiloxane was 0.09 mass % relative to the mass of the obtained condensate.

[Formation of Negative Resist Pattern Using Composition]

The above-mentioned composition having an amount of 5.12 g was dissolved in 5.77 g of PGMEA with the addition of 0.05 g of CPI-100Tf (as a photoacid generator) as in Example 1, thereby preparing an application liquid (or a resist liquid). The resist liquid was applied onto a glass substrate having a diameter of 100 mm by using a spin coater at a rotation speed of 250 rpm and a retention time of 10 seconds to form a resist film, followed by heating and prebaking the substrate at 90° C. for 1 minute. Incidentally, the content of the photoacid generator was 0.98 mass % relative to the mass of the condensate.

Then, the resist film was exposed to irradiation with ultraviolet rays by using the same apparatus and procedure as those used in Example 1, thereby forming a negative resist pattern with a minimum line width of 10 μm. Thereafter, the substrate was brought into an oven of 250° C. for 1 hour to heat and bake the negative resist pattern thereby obtaining a glass substrate having a negative resist pattern and 3.3 μm thickness. It was confirmed that the resist film formed on the glass substrate had no cracks, i.e., it was confirmed that the negative resist pattern was excellently formed. For information, the thickness was obtained by measuring depth differences in the pattern by using Dektak 8. On the other hand, a film obtained by conducting the exposure not through a photomask and then performing baking under the above-mentioned conditions was measured by the above-mentioned apparatus in terms of pencil hardness; as a result, a good pencil hardness of 5H was confirmed.

[Storage Stability]

The above-mentioned resist liquid was stored in a refrigerator of 5° C. or lower for three months. In the liquid of after the storage, neither whitening nor deposition of solid content was observed, with which an excellent storage stability was exhibited. Subsequently, the formation of a negative resist pattern was tried under the above-mentioned conditions and procedure; as a result, there was obtained a glass substrate having a negative resist pattern and 3.4 μm thickness and it was confirmed that the resist pattern formed on the glass substrate had no cracks, i.e., it was confirmed that the negative resist pattern was excellently obtained. The above-mentioned procedure was repeated in order to measure the pencil hardness thereby resulting in a pencil hardness of 5H, which was a satisfying hardness. Thus, the obtained resist film was found not having been subjected to deterioration with time during the storage of the resist liquid.

Example 3

The condensate and the composition thereof, obtained in Example 1 were used with the exception that the kind of the polyether-modified polydimethylsiloxane was different from that in Examples 1 and 2.

By adding 0.01 g of a polyether-modified polydimethylsiloxane (available from BYK-Chemie GmbH (Germany) under the trade name of BYK333) to 10.51 g of the condensate obtained in Example 1, thereby obtaining a composition that fell within the range of the present invention. The content of the polyether-modified polydimethylsiloxane was 0.10 mass % relative to the mass of the obtained condensate.

[Formation of Negative Resist Pattern Using Composition]

The above-mentioned composition having an amount of 4.70 g was dissolved in 4.66 g of PGMEA with the addition of 0.05 g of CPI-100Tf (as a photoacid generator) thereby preparing an application liquid (or a resist liquid). The resist liquid was applied onto a silicon substrate having a diameter of 100 mm by using a spin coater at a rotation speed of 250 rpm and a retention time of 10 seconds to form a resist film, followed by heating and prebaking the substrate at 90° C. for 1 minute. Incidentally, the content of the photoacid generator was 1.06 mass % relative to the mass of the condensate.

Then, the resist film was exposed to irradiation with ultraviolet rays by using the same apparatus and procedure as those used in Example 1, thereby forming a negative resist pattern with a minimum line width of 10 μm. Thereafter, the substrate was brought into an oven of 250° C. for 1 hour to heat and bake the negative resist pattern thereby obtaining a glass substrate having a negative resist pattern and 3.7 μm thickness. It was confirmed that the resist film formed on the glass substrate had no cracks, i.e., it was confirmed that the negative resist pattern was excellently formed. On the other hand, a film obtained by conducting the exposure not through a photomask and then performing baking under the above-mentioned conditions was measured by the above-mentioned apparatus in terms of pencil hardness; as a result, a good pencil hardness of 5H was confirmed. Thus, there were obtained good results in terms of film hardness and negative resist pattern formation even with the modification to the kind of the used polyether-modified polydimethylsiloxane.

[Storage Stability]

The above-mentioned resist liquid was stored in a refrigerator of 5° C. or lower for three months. In the liquid of after the storage, neither whitening nor deposition of solid content was observed, with which an excellent storage stability was exhibited. Subsequently, the formation of a negative resist pattern was tried under the above-mentioned conditions and procedure; as a result, there was obtained a glass substrate having a negative resist pattern and 3.6 μm thickness and it was confirmed that the resist pattern formed on the glass substrate had no cracks, i.e., it was confirmed that the negative resist pattern was excellently obtained. The above-mentioned procedure was repeated in order to measure the pencil hardness thereby resulting in a pencil hardness of 5H, which was a satisfying hardness. Thus, the obtained resist film was found not having been subjected to deterioration with time during the storage of the resist liquid, even with the modification to the kind of the used polyether-modified polydimethylsiloxane.

Example 4

The condensate and the composition thereof, obtained in Example 1 were used with the exception that the kind of the polyether-modified polydimethylsiloxane was different from that in Examples 1 to 3.

[Formation of Negative Resist Pattern Using Composition]

The composition obtained in Example 1 and having an amount of 5.01 g was dissolved in 5.06 g of PGMEA with the addition of 0.05 g of a photoacid generator (available from BASF Corporation (Germany) under the trade name of Irgacure 103) thereby preparing an application liquid (or a resist liquid). The resist liquid was applied onto a silicon substrate having a diameter of 100 mm by using a spin coater at a rotation speed of 250 rpm and a retention time of 10 seconds to form a resist film, followed by heating and prebaking the substrate at 90° C. for 1 minute. Incidentally, the content of the photoacid generator was 1.00 mass % relative to the mass of the condensate.

Then, the resist film was exposed to irradiation with ultraviolet rays by using the same apparatus and procedure as those used in Example 1, thereby forming a negative resist pattern with a minimum line width of 10 μm. Thereafter, the substrate was brought into an oven of 250° C. for 1 hour to heat and bake the negative resist pattern thereby obtaining a glass substrate having a negative resist pattern and 3.5 μm thickness. It was confirmed that the resist film formed on the glass substrate had no cracks, i.e., it was confirmed that the negative resist pattern was excellently formed. On the other hand, a film obtained by conducting the exposure not through a photomask and then performing baking under the above-mentioned conditions was measured by the above-mentioned apparatus in terms of pencil hardness; as a result, a good pencil hardness of 5H was confirmed. Thus, there were obtained good results in terms of film hardness and negative resist pattern formation even with the modification to the kind of the used photoacide generator.

Incidentally, Irgacure 103 used as the photoacid generator has a chemical structure as shown below.

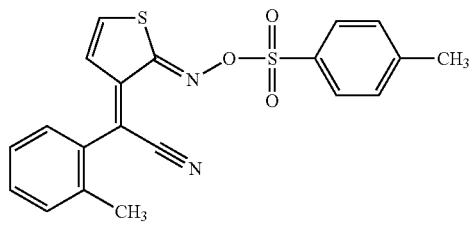 [SMILES: Cc1ccc(S(=O)(=O)O/N=C2\SC=C\C2=C(\C#N)c2ccccc2C)cc1]

[Storage Stability]

The above-mentioned resist liquid was stored in a refrigerator of 5° C. or lower for three months. In the liquid of after the storage, neither whitening nor deposition of solid content was observed, with which an excellent storage stability was exhibited. Subsequently, the formation of a negative resist pattern was tried under the above-mentioned conditions and procedure; as a result, there was obtained a glass substrate having a negative resist pattern and 3.5 μm thickness and it was confirmed that the resist pattern formed on the glass substrate had no cracks, i.e., it was confirmed that the negative resist pattern was excellently obtained. The above-mentioned procedure was repeated in order to measure the pencil hardness thereby resulting in a pencil hardness of 5H, which was a satisfying hardness. Thus, the obtained resist film was found not having been subjected to deterioration with time during the storage of the resist liquid, even with the modification to the kind of the used photoacid generator.

Comparative Example 1

The formation of a negative resist pattern was carried out in the same manner as that in Example 1 with the exception that the polyether-modified polydimethylsiloxane was not used.

More specifically, the composition obtained in Example 1 and having an amount of 5.56 g was dissolved in 5.08 g of PGMEA to synthesize a condensate. Thereafter, 0.05 g of CPI-100Tf (as a photoacid generator) was added thereto as in Example 1, thereby preparing an application liquid (or a resist liquid). The resist liquid was applied onto a glass substrate having a diameter of 100 mm by using a spin coater at a rotation speed of 250 rpm and a retention time of 10 seconds to form a resist film, followed by heating and prebaking the glass substrate at 90° C. for 1 minute.

Then, the resist film was exposed to irradiation with ultraviolet rays by using the same apparatus and procedure as those used in Example 1, thereby forming a negative resist pattern with a minimum line width of 10 μm. Thereafter, the substrate was brought into an oven of 250° C. for 1 hour to heat and bake the negative resist pattern thereby obtaining a glass substrate having a negative resist pattern and 3.3 μm thickness. It was confirmed that the resist film formed on the glass substrate had no cracks, i.e., it was confirmed that the negative resist pattern was excellently formed. However, its pencil hardness was 3H and therefore the resist film of 5H pencil hardness as obtained in Examples 1 and 2 could not be obtained, which is presumably because the polyether-modified polydimethylsiloxane was not used.

Comparative Example 2

Synthesis of Condensate

A three-neck flask of the same type as that used in Example 1 was charged with 70.3 g (0.394 mol) of $(CH_3)Si(OEt)_3$ serving as alkoxysilane A, 11.8 g (0.049 mol) of $PhSi(OEt)_3$ serving as alkoxysilane B and 7.3 g (0.049 mol) of $(CH_3)_2Si(OEt)_2$ serving as alkoxysilane C. The A:B:C mole ratio was 80:10:10, which was out of the range of the composition ratio of an alkoxysilane mixture D for a condensate of the present invention.

Then, the three-neck flask was further charged with 69.0 g of isopropanol, 51.2 g (2.844 mol) of water and 0.03 g of acetic acid, and the procedure of Example 1 was repeated thereby synthesizing a condensate. The yield of the condensate was 51.1 g and the average molecular weight was Mw=1080.

Subsequently, 0.05 g of BYK307 (as a polyether-modified polydimethylsiloxane) was added to the condensate thereby obtaining a composition that did not fall within the range of the present invention. The content of the polyether-modified polydimethylsiloxane was 0.10 mass % relative to the mass of the above-mentioned condensate.

[Formation of Negative Resist Pattern Using Composition]

The above-mentioned composition having an amount of 5.02 g was dissolved in 5.09 g of PGMEA with the addition of 0.05 g of CPI-100Tf (as a photoacid generator) as in Example 1, thereby preparing an application liquid (or a resist liquid). The resist liquid was applied onto a glass substrate having a diameter of 100 mm by using a spin coater at a rotation speed of 250 rpm and a retention time of 10 seconds to form a resist film, followed by heating and prebaking the substrate at 90° C. for 1 minute. Incidentally, the content of the photoacid generator was 1.00 mass % relative to the mass of the condensate.

Then, the resist film was exposed to irradiation with ultraviolet rays by using the same apparatus and procedure as those used in Example 1, thereby forming a negative resist pattern with a minimum line width of 10 μm. Thereafter, the substrate was brought into an oven of 250° C. for 1 hour to heat and bake the negative resist pattern. As a result of this, a film having a resist pattern was provided with cracks. Though a formation of a film having no cracks was tried by modifying the rotation speed and the time, cracks were produced if the film thickness became 1.7 μm or more. The composition was produced to have a silicon content higher than that falling within a range of the present invention so that the stress generated by heating and curing at the inner portion of the film became excessively increased, which was presumably the result of a film not being produced to be hard with a thickness of 3.0 μm.

The invention claimed is:
1. A composition comprising:
1) an alkoxysilane condensate obtained by the condensation of
i) alkoxysilane A represented by general formula (1): $(CH_3)Si(OR^1)_3$,
ii) alkoxysilane B represented by general formula (2): $(Ph)Si(OR^1)_3$, and
iii) alkoxysilane C represented by general formula (3): $(CH_3)_2Si(OR^1)_2$ at an A:B:C mole ratio within the range of 30-70:10-50:20-60, and wherein $R^1$ mutually independently represents a methyl group or an ethyl group;
2) a polyether-modified polydimethylsiloxane; and
3) a photoacid generator.
2. A composition as claimed in claim 1, wherein the polyether-modified polydimethylsiloxane is a compound represented by general formula (4):

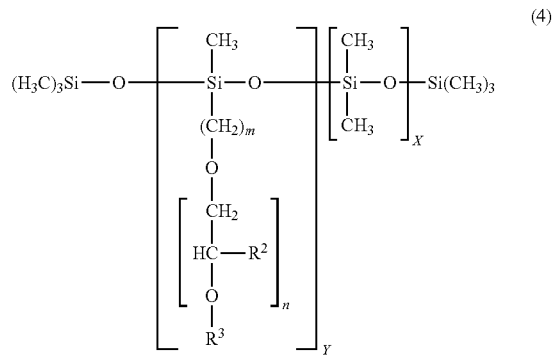

wherein $R^2$ mutually independently represents a hydrogen atom or a methyl group, $R^3$ mutually independently represents a $C_1$-$C_{20}$ alkyl group or a $C_6$-$C_{10}$ aryl group, "m" represents an integer of 1-30, "n" represents an integer of 1-30, "X" represents an integer of 1-50, and "Y" represents an integer of 1-50, and wherein the content of the polyether-modified polydimethylsiloxane is not lower than 0.001 mass % and not higher than 5 mass % relative to the condensate.

3. A composition as claimed in claim 1, wherein the content of the photoacid generator is not lower than 0.01 mass % and not higher than 5 mass % relative to the condensate.

4. A method for producing a cured film comprising the steps of:
(1) adding an organic solvent to a composition as claimed in claim 1 to produce an application liquid;
(2) applying the application liquid onto a substrate to form a film; and
(3) heating and baking the substrate,
wherein the cured film has a thickness of at least 3.0 μm and a pencil hardness of at least 5H.

5. A method for producing a composition as claimed in claim 1, comprising the steps of:
1) adding water, a water-soluble organic solvent E and an acid catalyst to an alkoxysilane mixture D of before the condensation of
i) alkoxysilane A represented by general formula (1): $(CH_3)Si(OR^1)_3$,
ii) alkoxysilane B represented by general formula (2): $(Ph)Si(OR^1)_3$, and
iii) alkoxysilane C represented by general formula (3): $(CH_3)_2Si(OR^1)_2$ at an A:B:C mole ratio within the range of 30-70:10-50:20-60, wherein $R^1$ mutually independently represents a methyl group or an ethyl group, thereby producing a mixed substance of before condensation;
2) hydrolyzing and condensing the mixed substance of before condensation thereby providing a reaction system with a condensate;
3) extracting the condensate with a water-insoluble organic solvent F while extracting the acid catalyst with water;

4) removing the organic solvent F;
5) adding a polyether-modified polydimethylsiloxane; and
6) adding a photoacid generator.

6. A method for producing a composition, as claimed in claim 5, wherein water is used in an amount of 1.5-5 times larger than that of alkoxy groups that the alkoxysilane mixture D has, in mole ratio.

7. A method for producing a composition, as claimed in claim 5, wherein the organic solvent E comprises alcohol.

8. A method for producing a composition, as claimed in claim 5, wherein the acid catalyst comprises acetic acid.

9. A method for forming a negative pattern, comprising the steps of:
(1) applying a composition as claimed in claim 1 onto a substrate to form a film,
(2) irradiating the film with high-energy beams to generate acid at an irradiated portion to accelerate a further condensation of the condensate at the irradiated portion thereby making the film insoluble in an alkali developing solution; and
(3) removing a non-irradiated portion of the film by using the alkali developing solution thereby forming a negative pattern.

10. A method for forming a negative pattern, as claimed in claim 9, wherein the high-energy beams used for the irradiation comprises electromagnetic waves or electron beams of a wavelength of not larger than 400 nm.

* * * * *